(12) United States Patent
Shimoda et al.

(10) Patent No.: US 9,865,471 B2
(45) Date of Patent: Jan. 9, 2018

(54) ETCHING METHOD AND ETCHING APPARATUS

(71) Applicant: Tokyo Electron Limited, Tokyo (JP)

(72) Inventors: Gaku Shimoda, Miyagi (JP); Hotaka Maruyama, Miyagi (JP); Takanori Sato, Miyagi (JP); Masafumi Urakawa, Miyagi (JP); Masahiro Ogasawara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/133,314

(22) Filed: Apr. 20, 2016

(65) Prior Publication Data
US 2016/0322230 A1    Nov. 3, 2016

(30) Foreign Application Priority Data

Apr. 30, 2015  (JP) .................................. 2015-093509
Jul. 14, 2015  (JP) .................................. 2015-140232

(51) Int. Cl.
*H01L 21/3065* (2006.01)
*H01J 37/32* (2006.01)
*H01L 21/67* (2006.01)

(52) U.S. Cl.
CPC .... *H01L 21/3065* (2013.01); *H01J 37/32091* (2013.01); *H01J 37/32449* (2013.01); *H01J 37/32165* (2013.01); *H01J 37/32724* (2013.01); *H01J 2237/334* (2013.01); *H01J 2237/3345* (2013.01); *H01J 2237/3348* (2013.01); *H01L 21/67109* (2013.01)

(58) Field of Classification Search
CPC ............ H01L 21/3065; H01L 21/67109; H01J 37/32091; H01J 37/32449; H01J 37/32165; H01J 37/32724; H01J 2237/3348; H01J 2237/3345; H01J 2237/334
See application file for complete search history.

(56) References Cited

U.S. PATENT DOCUMENTS

| | | | | |
|---|---|---|---|---|
| 5,651,858 A * | 7/1997 | Lin | ..................... | H01L 21/3065 257/E21.218 |
| 7,416,676 B2 * | 8/2008 | Fujihara | .............. | H01L 21/3065 216/41 |
| 2004/0222190 A1 * | 11/2004 | Horiguchi | ......... | H01J 37/32568 216/79 |
| 2006/0180571 A1 * | 8/2006 | Fujihara | .............. | H01L 21/3065 216/67 |
| 2010/0216311 A1 * | 8/2010 | Tamaki | ............... | H01L 21/3065 438/700 |
| 2010/0248488 A1 * | 9/2010 | Agarwal | ........... | H01J 37/32091 438/714 |

(Continued)

FOREIGN PATENT DOCUMENTS

JP    2013-258244    12/2013

*Primary Examiner* — Anita Alanko
(74) *Attorney, Agent, or Firm* — IPUSA, PLLC

(57) ABSTRACT

A method for etching a silicon film formed on a substrate includes supplying HBr gas, $NF_3$ gas, and $O_2$ gas into a chamber and performing a plurality of etching processes on the silicon film with a plasma generated by the supplied HBr gas, $NF_3$ gas, and $O_2$ gas, gradually reducing a flow rate of the HBr gas during the plurality of etching processes, and adjusting a flow rate of the $O_2$ gas according to the reduction of the HBr gas.

11 Claims, 10 Drawing Sheets

(56) References Cited

U.S. PATENT DOCUMENTS

| | | | |
|---|---|---|---|
| 2011/0195577 A1* | 8/2011 | Kushibiki | H01J 37/32091 438/714 |
| 2015/0149970 A1* | 5/2015 | Kuboi | H01J 37/32926 716/54 |
| 2016/0247666 A1* | 8/2016 | Urakawa | H01J 37/32174 |
| 2016/0293431 A1* | 10/2016 | Sriraman | H01L 21/3065 |

* cited by examiner

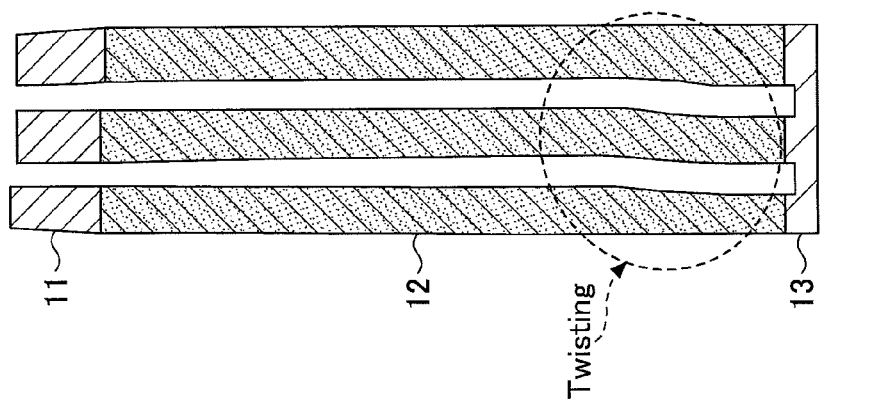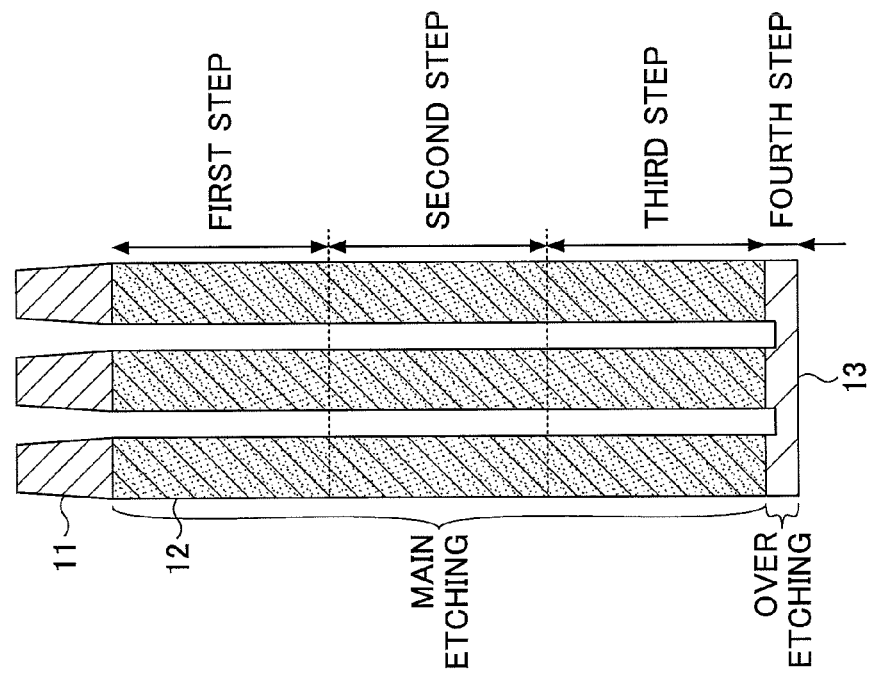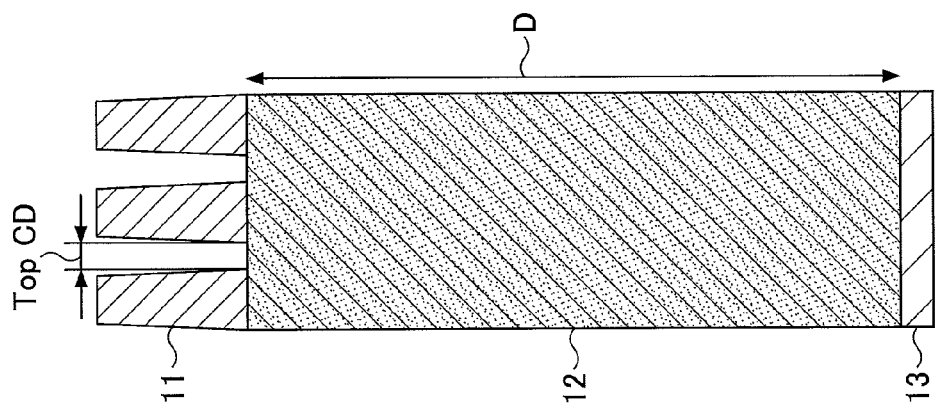

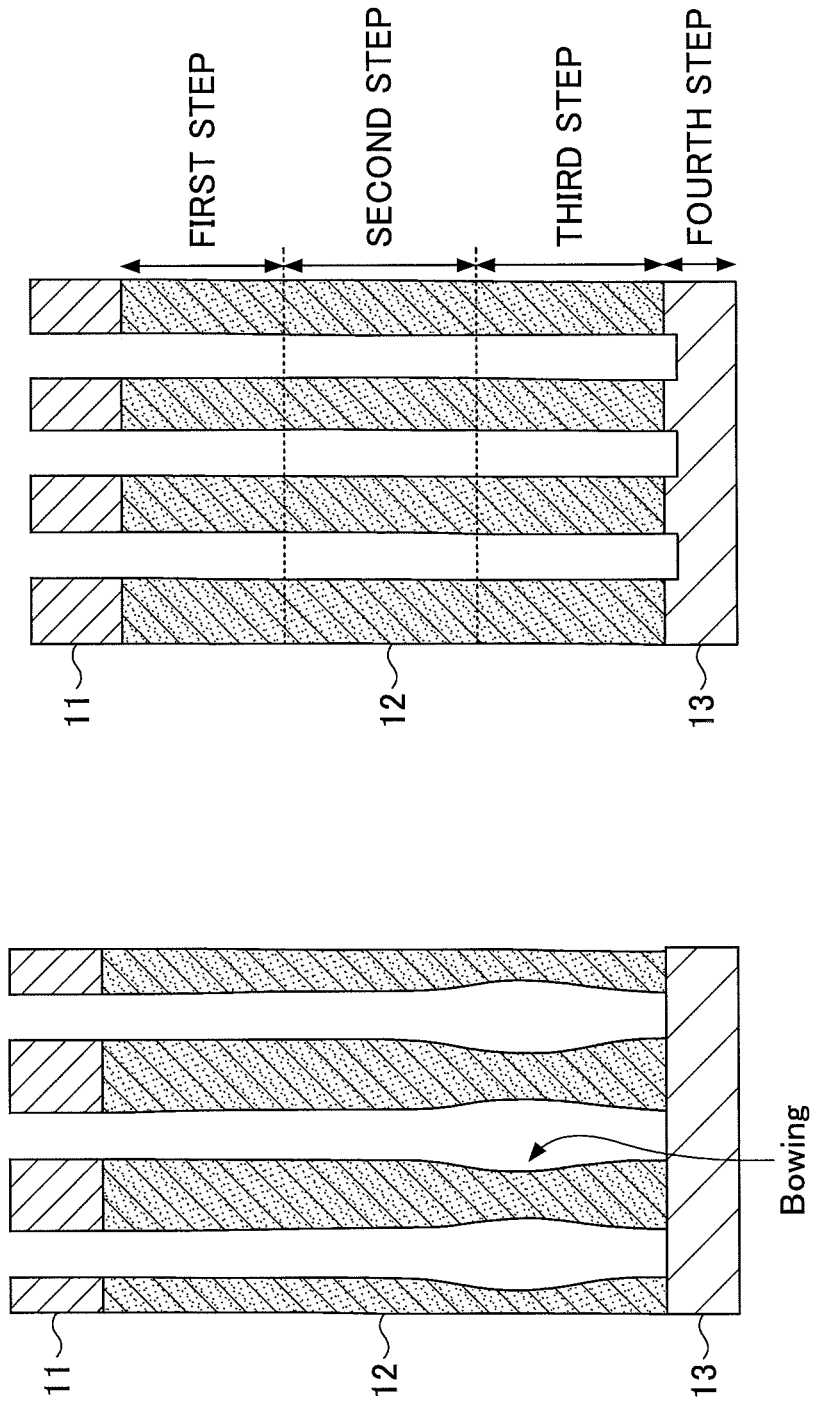

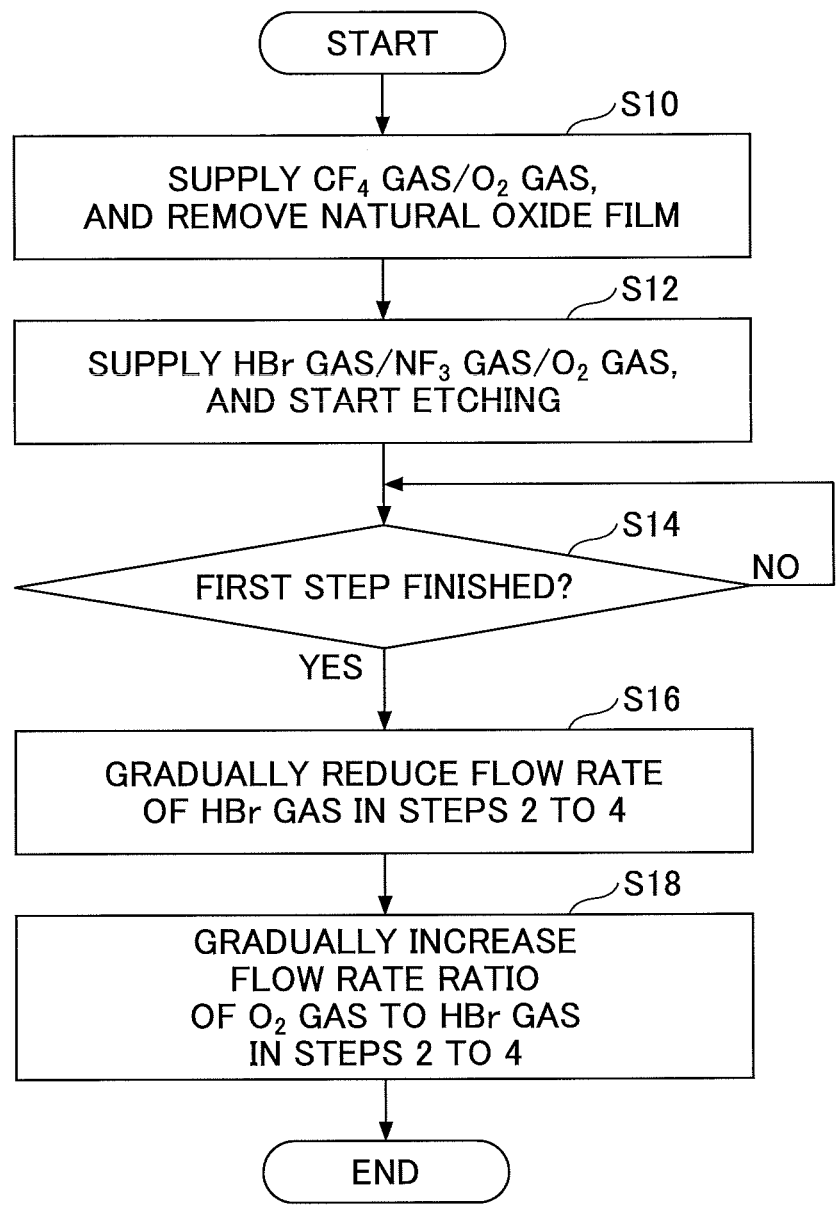

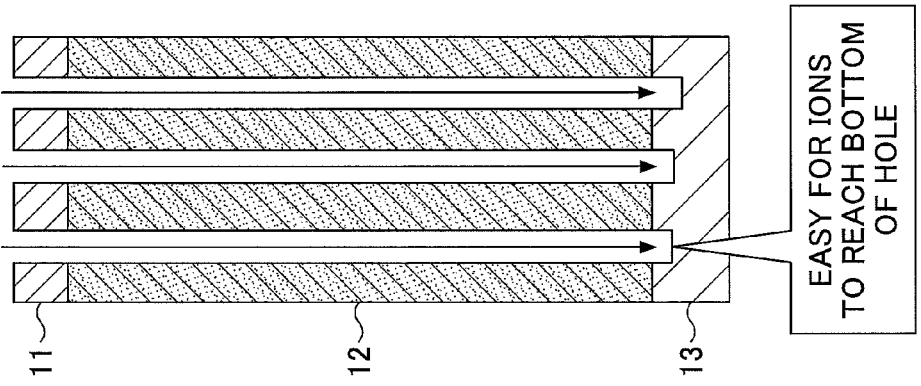
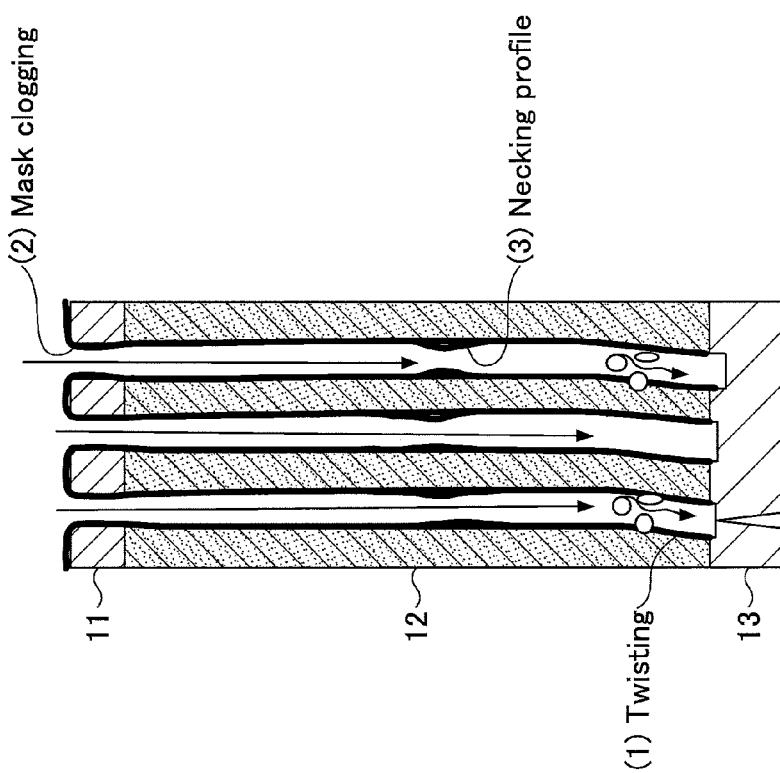

ETCHING METHOD AND ETCHING APPARATUS

CROSS-REFERENCE TO RELATED APPLICATION

This application is based upon and claims the benefit of priority of Japanese Patent Application Nos. 2015-093509 and 2015-140232, filed on Apr. 30, 2015 and Jul. 14, 2015, respectively, the entire contents of which are incorporated herein by reference.

BACKGROUND OF THE INVENTION

1. Field of the Invention

The present invention generally relates to an etching method and an etching apparatus.

2. Description of the Related Art

There is proposed a method for etching a target etching layer containing polycrystalline silicon by using plasma generated by supplying HBr (hydrogen bromide) gas, $NF_3$ (nitrogen trifluoride) gas, and $O_2$ (oxygen) gas (See, for example, Japanese Laid-Open Patent Application No. 2013-258244).

However, in a case of forming a hole in a silicon film by etching, "twisting" occurs when the aspect ratio becomes, for example, greater than or equal to 15. "Twisting" is a phenomenon in which a tip of an etched hole becomes twisted and results into degradation of the shape of the etched hole. In recent years, the problem of twisting is increasing particularly due to the increase in the demand for smaller devices and high-aspect ratio etching.

One aspect of the present invention aims to improve the shape of an etched object.

SUMMARY OF THE INVENTION

An aspect of the present invention provides a method for etching a silicon film formed on a substrate. The method includes supplying HBr gas, $NF_3$ gas, and $O_2$ gas into a chamber and performing a plurality of etching processes on the silicon film with a plasma generated by the supplied HBr gas, $NF_3$ gas, and $O_2$ gas, gradually reducing a flow rate of the HBr gas during the plurality of etching processes, and adjusting a flow rate of the $O_9$ gas according to the reduction of the HBr gas.

The object and advantages of the embodiments will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

Other objects, features and advantages of the present invention will become more apparent from the following detailed description when read in conjunction with the accompanying drawings, in which:

FIGS. 2A to 2C are diagrams depicting a twisting phenomenon relative to an ideal etching process;

FIGS. 5A and 5B are diagrams depicting a shape of an etched object according to an embodiment of the present invention and a comparative example;

FIG. 6 is a flowchart depicting an etching method according to an embodiment of the present invention;

FIGS. 9A and 9B are diagrams depicting effects of an etching method according to a modified example of the present invention.

DETAILED DESCRIPTION OF THE PREFERRED EMBODIMENTS

Figure 1:
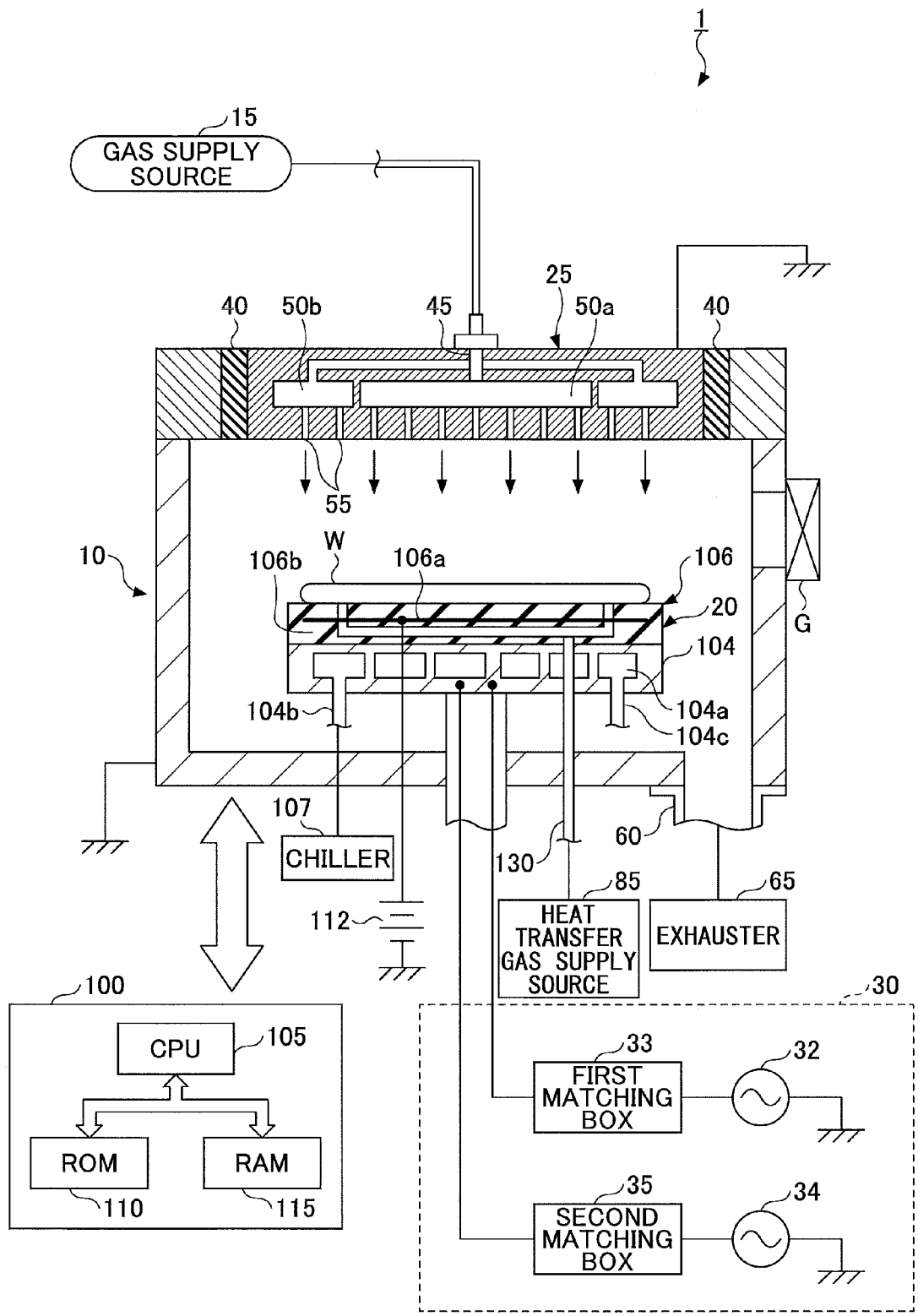
FIG. 1 is a vertical cross-sectional view of an etching apparatus according to an embodiment of the present invention.

Embodiments of the present invention are described below with reference to the accompanying drawings. In the specification and drawings, the same or substantially the same elements are referred to using the same reference numeral, and a description thereof is not repeated.

<Overall Configuration of Etching Apparatus>

First, an etching apparatus 1 according to an embodiment of the present invention is described with reference to FIG. 1. FIG. 1 is a vertical cross-sectional view of the etching apparatus 1. The etching apparatus 1 is a parallel plate plasma processing apparatus (capacitively coupled plasma [CCP] processing apparatus) in which a loading table 20 and a gas shower head 25 are opposed to each other in a chamber 10. The loading table 20 serves to hold a semiconductor wafer (hereinafter simply referred to as "wafer") W and also serves as a lower electrode. The gas shower head 25 serves to supply gas like a shower into the chamber 10 and also serves as an upper electrode.

The chamber 10 is formed of, for example, aluminum having an anodized surface, and has a cylindrical shape. The chamber 10 is electrically grounded. The loading table 20 is placed at the bottom of the chamber 10, and the wafer W is loaded onto the loading table 20. The wafer W is an example of a substrate that is an object of etching. On the wafer W, a mask film is deposited on a polysilicon film.

The loading table 20 includes a support 104 formed of, for example, aluminum (Al), titanium (Ti) or silicon carbide (SiC), and an electrostatic chuck serving as an upper surface of the loading table 20. The electrostatic chuck 106 is for electrostatically attracting the wafer W. The electrostatic chuck 106 includes a chuck electrode 106a and insulators 106b that hold the chuck electrode 106a therebetween. The insulators 106b are formed of a dielectric such as alumina ($AL_2O_3$).

A direct-current (DC) voltage source 112 is connected to the chuck electrode 106a, so that a DC electric current is supplied from the DC voltage source 112 to the chuck electrode 106a. As a result, the wafer W is attracted and adheres to the electrostatic chuck 106 with a Coulomb force.

A refrigerant channel 104a is formed in the support 104. A refrigerant inlet pipe 104b and a refrigerant outlet pipe 104c are connected to the refrigerant channel 104a. A refrigerant such as cooling water or brine output from a chiller 107 circulates through the refrigerant inlet pipe 104b, the refrigerant channel 104a, and the refrigerant outlet pipe 104c, so that the loading table 20 and the electrostatic chuck 106 are cooled.

A heat transfer gas supply source 85 supplies a heat transfer gas such as helium (He) gas or argon (Ar) gas onto a bottom surface of the wafer W on the electrostatic chuck 106 through a gas supply line 130. According to this configuration, the temperature of the electrostatic chuck 106 is controlled by the refrigerant circulated through the refrigerant channel 104a and the heat transfer gas supplied onto the bottom surface of the wafer W. As a result, it is possible to control the wafer W to a predetermined temperature. In addition, a heating source may also be used for heating the wafer W.

An electric power supply apparatus 30 that supplies dual-frequency superimposed electric power is connected to the loading table 20. The electric power supply apparatus 30 includes a first high-frequency power supply 32 and a second high-frequency power supply 34. The first high-frequency power supply 32 supplies first high-frequency electric power (high-frequency electric power HF for plasma excitation) of a first frequency. The second high-frequency power supply 34 supplies second high-frequency electric power (high-frequency electric power LF for biasing) of a second frequency that is lower than the first frequency. The first high-frequency power supply 32 is electrically connected to the loading table 20 through a first matching box 33. The second high-frequency power supply 34 is electrically connected to the loading table 20 through a second matching box 35. The first high-frequency power supply 32 applies, for example, 100 MHz high-frequency electric power HF for plasma excitation to the loading table 20. The second high-frequency power supply 34 applies, for example, 13.56 MHz high-frequency electric power LF for biasing to the loading table 20. The high-frequency electric power HF, which is applied to the loading table 20 according to this embodiment, may alternatively be applied to the gas shower head 25.

The first matching box 33 matches load impedance to the internal (or output) impedance of the first high-frequency power supply 32. The second matching box 35 matches load impedance to the internal (or output) impedance of the second high-frequency power supply 34. The first matching box 33 operates so that the internal impedance of the first high-frequency power supply 32 and the load impedance apparently match when a plasma is generated in the chamber 10. The second matching box 35 operates so that the internal impedance of the second high-frequency power supply 34 and the load impedance apparently match when a plasma is generated in the chamber 10.

The gas shower head 25 is attached to a ceiling of the chamber 10 through an insulating member 40 that insulates a periphery of the gas shower head 25, so as to close an opening in the ceiling. The gas shower head 25 may be electrically grounded as depicted in FIG. 1. Alternatively, the gas shower head 25 may be connected to a variable DC power supply so that a predetermined DC voltage is applied to the gas shower head 25.

A gas introduction port 45 for introducing gas is formed in the gas shower head 25. A center-side diffusion chamber 50a and an edge-side diffusion chamber 50b, which diverge from the gas introduction port 45, are provided in the gas shower head 25. The output gas of a gas supply source 15 is supplied into the diffusion chambers 50a and 50b through the gas introduction port 45, and is diffused in the diffusion chambers 50a and 50b to be introduced into the chamber 10 toward the loading table 20 through multiple gas supply holes 55.

An evacuation port 60 is formed at a bottom surface of the chamber 10, and the chamber 10 is evacuated with an exhauster 65 connected to the evacuation port 60. This makes it possible to maintain the degree of vacuum inside the chamber 10 at a predetermined value. A sidewall of the chamber 10 is provided with a gate valve G. The wafer W is transferred into and out of the chamber 10 by opening and closing the gate valve G.

The etching apparatus 1 includes a control part 100 that controls an operation of the entire etching apparatus 1. The control part 100 includes a central processing unit (CPU) 1, a read-only memory (ROM) 110, and a random access memory (RAM) 115. The CPU 105 executes desired processes such as the below-described etching and discharging in accordance with various recipes (instructions) stored in these storage areas (the ROM 110 and the RAM 115). Apparatus control information for process conditions, including a process time, a pressure (gas discharge), high-frequency electric power, a voltage, various gas flow rates, the internal temperatures of the chamber 10 (such as an upper electrode temperature, a chamber sidewall temperature, an electrostatic chuck temperature), and the temperature of the chiller 107, is written in the recipes. The recipes indicating these programs and processing conditions may be stored in a hard disk drive or a semiconductor memory. Alternatively, the recipes may be contained in a computer-readable portable storage medium such as a CD-ROM or DVD and loaded at predetermined positions in the storage areas.

At the time of etching, the opening and closing of the gate valve G is controlled, so that the wafer W is transferred into the chamber 10 to be loaded onto the loading table 20. A DC electric current is supplied from the DC voltage source 112 to the chuck electrode 106a, so that the wafer W is attracted and adheres to and is held by the electrostatic chuck 106 with a Coulomb force.

Next, an etching gas, high-frequency electric power HF for plasma excitation, and high-frequency electric power LF for biasing are supplied into the chamber 10, so that a plasma is generated. Etching is performed with the generated plasma.

After etching, a DC voltage HV that is opposite in polarity to that at the time of attracting the wafer W is applied from the DC voltage source 112 to the chuck electrode 106a so as to release electric charge from the wafer W, so that the wafer W is removed from the electrostatic chuck 106. The opening and closing of the gate valve G is controlled, so that the wafer W is transferred out of the chamber 10.

[Etching Method]

An etching method according to an embodiment of the present invention is described below. As illustrated in FIG. 2A, etching is performed on a target etching film 12 by using a mask 11. In this embodiment, the target etching film 12 is a polysilicon (polycrystalline silicon) film 12, and a silicon oxide film ($SiO_2$) is used as the mask 11. Note that the target etching film is not limited to a polysilicon film 12. For example, the target etching film may be an amorphous silicon film or a single crystalline layer. Further, a silicon oxide film or a silicon nitride film (SiN) may be the target etching film. Further, the mask 11 may be an oxide film or a nitride film. A base film 13 under the polysilicon film 12 may be, for example, a silicon oxide film or a silicon nitride film.

FIG. 2A depicts an example of a configuration having films formed on a substrate before being subjected to etching. FIG. 2B depicts an example of a cross-sectional shape of holes that is formed by etching the polysilicon film 12.

The term "aspect ratio" is defined as the ratio between a top CD of the polysilicon film 12 and a depth D of the polysilicon film 12. For example, although a satisfactory etching shape can be obtained when the aspect ratio is approximately 15 to 20 as illustrated in FIG. 2B, such satisfactory etching shape may be difficult to obtain when the aspect ratio is the recently demanded aspect ratio of 25 to 30. Obtaining such satisfactory etching shape is particularly difficult when the aspect ratio is 30 or more. As a result, a phenomenon in which the tip of a hole (bottom side of hole) formed by etching bends or twists (hereinafter referred to as "twisting") occurs as illustrated in FIG. 2C. Next, the process conditions for resolving the problem of twisting and an etching method performed under such process conditions according to an embodiment of the present invention are described. The process conditions and etching method according to an embodiment of the present invention are described in comparison with process conditions and an etching method of a comparative example.

In etching the film configuration illustrated in FIG. 2A, a main etching process for etching the polysilicon film 12 and an over-etching process for etching the base film 13 are performed. For example, HBr (hydrogen bromide) gas, $NF_3$ (nitrogen trifluoride) gas, and $O_2$ (oxygen) gas are used as the etching gas (first process condition). The polysilicon film 12 is etched with a plasma formed by these gases of the first process condition via the mask 11. Then, the over-etching process is performed in which the base film 13 is etched under the first process condition. The etching method of this embodiment is suitable for manufacturing a three-dimensional stacked semiconductor memory such as a 3D NAND flash memory.

In the etching method of this embodiment, the polysilicon film 12 is etched consecutively after removing (etching) a natural oxide film on the polysilicon film 12 via the mask 11. That is, after etching the natural oxide film on the polysilicon film 12 via the mask 11 for approximately 10 seconds by using a plasma generated by $CF_4$ gas and $O_2$ gas, the etching process is continued to be performed on the polysilicon film 12.

<Etching Method of Comparative Example>

Next, an etching method according to a comparative example is described. In the etching method of the comparative example, the polysilicon film 12 is etched under the following process conditions.

| | |
|---|---|
| Pressure | 80 mT (10.7 Pa) |
| High-frequency electric power HF | 400 W |
| High-frequency electric power LF | 2350 W pulse wave |
| | (frequency 0.1 kHz, Duty ratio 30%) |
| Gas | HBr/$NF_3$/$O_2$ |
| Etching time | 90 seconds |
| Temperature of Loading table 20 | 65° C. |

Figure 3A:
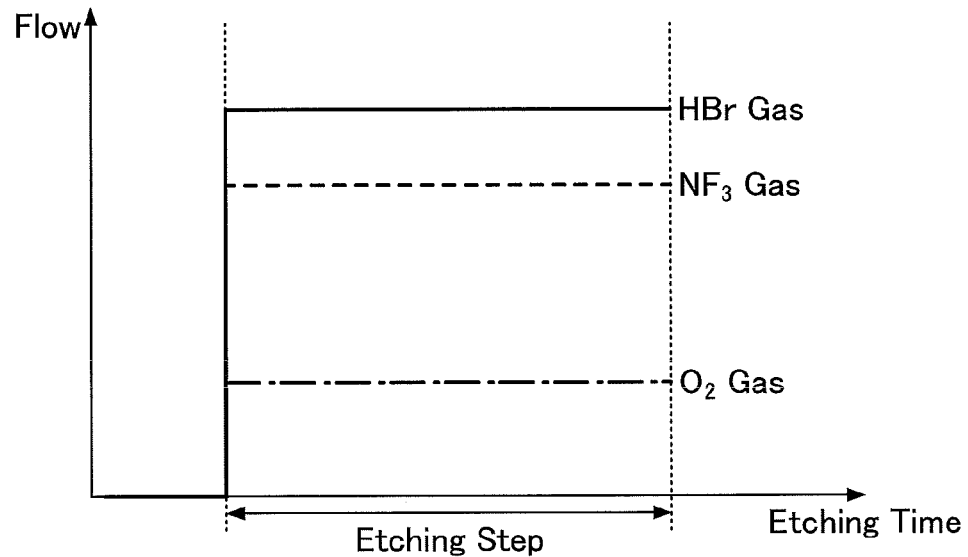
FIGS. 3A to 3C are time charts depicting the supply of gas during an etching process according to an embodiment of the present invention and a comparative example.

According to the etching method of the comparative example, the base film 13 is over-etched, for example, approximately 30% after performing the main etching process on the polysilicon film 12. As illustrated in FIG. 3A, the HBr/$NF_3$/$O_2$ gases are supplied at a constant flow rate during the main etching process and the over-etching process of the comparative example.

In a case where the aspect ratio is approximately 15 when performing plasma-etching under the above-described process conditions, the polysilicon film 12 can be fabricated to have a substantially vertical etching shape as illustrated in FIG. 2B. However, when the aspect ratio becomes as high as, for example, 20, twisting occurs and results in degradation (worsening) of the etching shape of the polysilicon film 12 as illustrated in FIG. 2C.

Figure 4A:
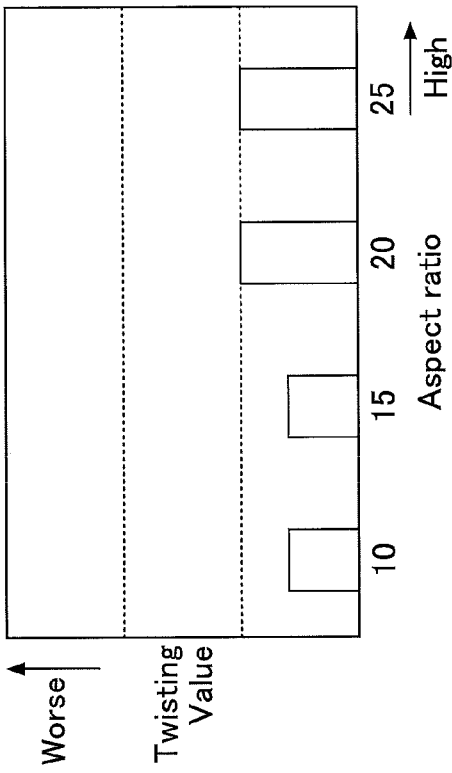
FIGS. 4A and 4B are diagrams depicting a relationship between a twisting phenomenon and an aspect ratio according to an embodiment of the present invention and a comparative example.

FIG. 4A depicts an example of the etching results of the comparative example under the above-described process conditions. As illustrated in FIG. 4A, twisting occurs only to an insignificant degree when the aspect ratio is 15 or lower. However, twisting starts to occur significantly when the aspect ratio exceeds 15 and becomes evident when the aspect ratio is 25 or higher. The problem of twisting that occurs during etching at an aspect ratio higher than or equal to 25 is unacceptable particularly for complying with recent demands for miniaturizing devices.

One of the causes of twisting is the direction of ions being adversely affected or changed by the excessive amount of silicon (Si) and etching-reaction products (products generated during etching such as $SiBr_xO_y$, $SiOF_x$) (see Reaction Formula (1) below) that adhere to an sidewall of an etched hole.

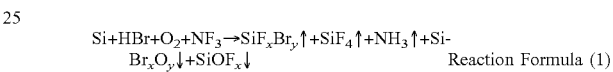

$Si+HBr+O_2+NF_3 \rightarrow SiF_xBr_y\uparrow+SiF_4\uparrow+NH_3\uparrow+SiBr_xO_y\downarrow+SiOF_x\downarrow$  Reaction Formula (1)

According to the Reaction formula (1), $SiF_xBr_y$, $SiF_4$, and $NH_3$ are volatile substances that are exhausted out of the chamber 10 whereas are $SiBr_xO_y$ and $SiOF_x$ are depositional substances that adhere to, for example, a side part of an etched hole.

The temperature of the loading table 20 is 65° C. under the above-described process conditions. However, in a case of performing the main etching process and then performing the over-etching process under the same process conditions except for controlling the temperature of the loading table 20 to a high temperature of 100° C., the amount of deposits adhering to the walls or the like of the etched hole is reduced but the side part of the etched hole becomes wider as the etching process progresses and leads to bowing (widening of the side part of the etched hole). As a result, a satisfactory etching shape cannot be obtained.

<Etching Method According to Embodiment of Present Invention>

Therefore, the etching method according to an embodiment of the present invention changes the flow rate of gas during etching (see FIG. 3B) while performing the etching process under the above-described conditions except for controlling the temperature of the loading table 20 to 100° C. More specifically, the flow rates of HBr gas and $O_2$ gas are changed while controlling the $NF_3$ gas to a constant flow rate.

In the etching method according this embodiment, the flow rate of each gas is control in which the main etching process is performed on the polysilicon film 12 in three substantially equally divided steps (first to third step) and the over-etching process is performed on the base film 13 (fourth Step). The control part 100 controls the flow rate of each gas.

Figure 3B:
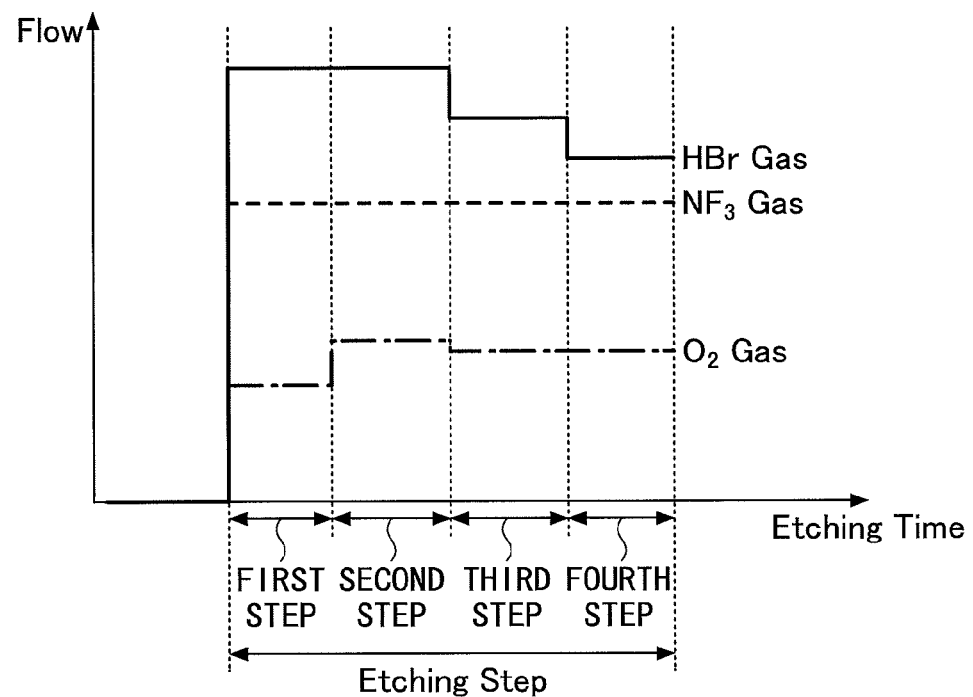

In the first step of FIG. 3B, the flow rate of HBr gas, $NF_3$ gas, and $O_2$ gas is set to an initial value, respectively. HBr is mainly for accelerating etching and is a main constituent of the etching gas. $NF_3$ gas is mainly for removing deposits adhered to the mask 11. $O_2$ gas is mainly for protecting the wall part of the etched holes of the mask 11 and the polysilicon film 12.

Bowing tends to occur when the flow rate of HBr gas increases and also tends to occur when the flow rate ratio of HBr gas to $O_2$ gas increases. Thus, in order to prevent bowing from occurring during the etching of the polysilicon film 12, increasing the flow rate ratio of $O_2$ gas to HBr is preferred along with reducing the flow rate of HBr gas.

More specifically, the flow rate of HBr gas in the first and second steps is controlled to be greater than the flow rate of HBr gas in the third and fourth steps as illustrated in FIG. 3B. Thereby, etching is accelerated in the first and second steps. Further, the flow rate of HBr gas is controlled to gradually decrease from the second step to the fourth step. Accordingly, etching can be gradually restrained to prevent bowing from occurring in the etched hole. Although the flow rate of HBr gas in the first step is the same as the flow rate of HBr gas in the second step in FIG. 3B, the flow rate of HBr gas in the first step may be gradually increased or reduced relative to the flow rate of HBr gas in the second step.

Further, the flow rate of $O_2$ gas in the second step can be controlled so that the flow rate of the $O_2$ gas of the second step becomes greater than the flow rate of $O_2$ gas of the first step. Thereby, the flow rate ratio of $O_2$ gas to HBr gas can be increased, so that the wall part of the etched hole formed in the silicon film 12 can be protected.

Further, the flow rate of $O_2$ gas in the third and fourth steps is controlled to be slightly lower than the flow rate of $O_2$ of the second step. The flow rate of $O_2$ in the third and fourth may be the same as the flow rate of $O_2$ in the second step. Alternatively, the flow rate of $O_2$ gas in the third and fourth steps may gradually decrease or increase relative to the flow rate of $O_2$ gas in the second step. Further, the flow rate of HBr gas gradually decreases from the second step to the fourth step. Accordingly, the flow rate ratio of $O_2$ gas to the OBr gas in the second to fourth steps gradually increases. Thus, bowing can be prevented more effectively.

Figure 3C:
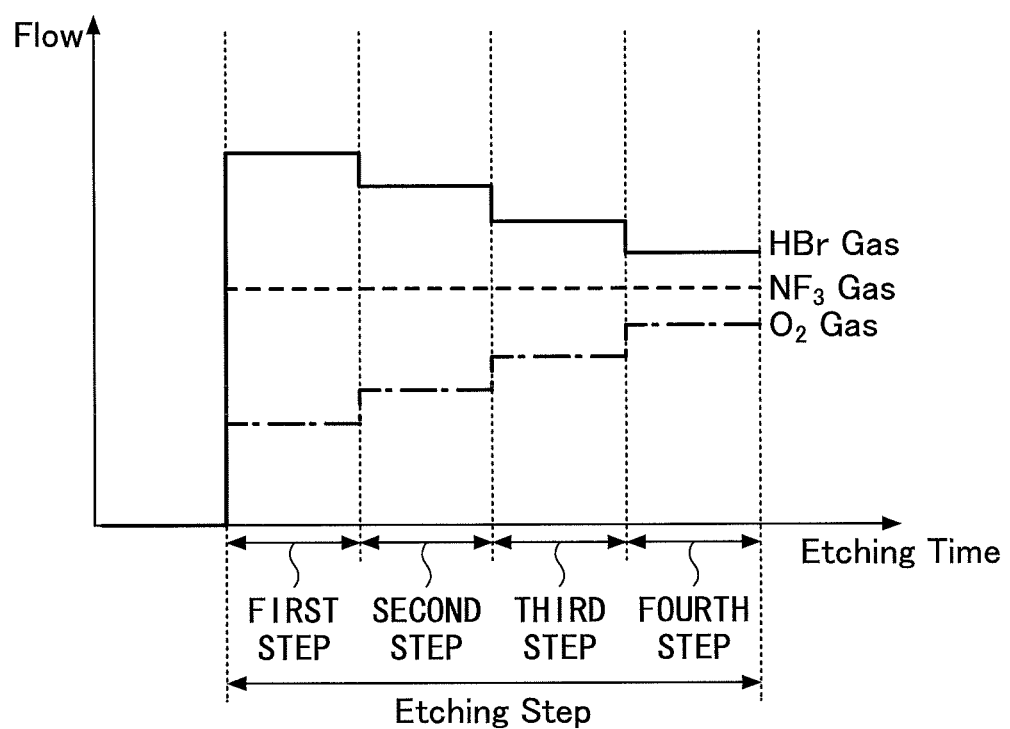

In this embodiment, the flow rate of $O_2$ gas is changed according to the flow rate of HBr. More specifically, the flow rate of $O_2$ gas is controlled so that the flow rate ratio of the $O_2$ gas to HBr gas becomes gradually higher for preventing bowing. Although the $O_2$ gas is controlled to be equal to the $O_2$ gas in the embodiment of FIG. 3B, the $O_2$ may be different from the $O_2$ gas of the third and fourth steps. For example, the flow rate ratio of $O_2$ gas to HBr gas can be gradually increased from the first to fourth steps as illustrated in FIG. 3C, so that twisting is prevented from occurring and bowing can be restrained. The etching process is preferred to be performed for two steps or more, and more preferably, three steps of more. The control of the flow rate ratio between HBr gas and $O_2$ gas changes according to the temperature of the loading table 20 and the structure of the sample.

Further, the flow rate of NF3 may be controlled to be constant in all steps (first to fourth step) as illustrated in FIG. 3B. Alternatively, the flow rate of $NF_3$ gas may be controlled to be constant in the first and second steps and gradually increased in the third and fourth steps. Alternatively, the flow rate of $NF_3$ may be controlled so that the flow rate of $O_2$ gas increases in correspondence with the increase in the flow rate of $NF_3$. Thereby, the forming of a protective film for protecting the sidewall of the etched hole can be accelerated while removing the deposits adhered to the mask 11. Further, $SF_6$ gas may be supplied instead of the $NF_3$ gas.

Figure 4B:
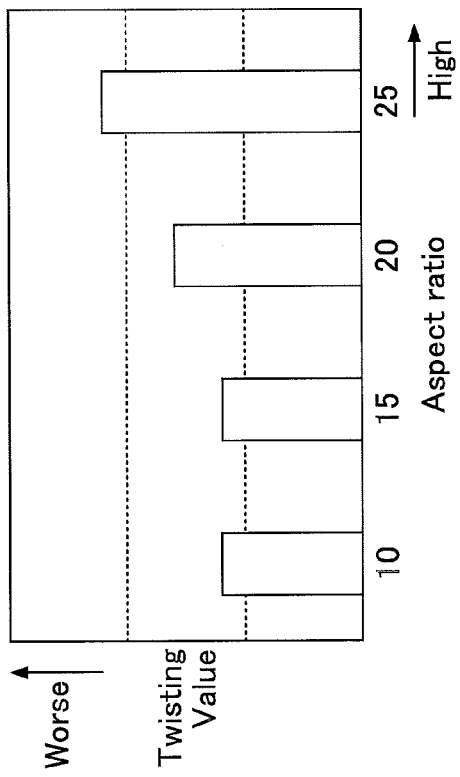

FIG. 4B depicts an example of the etching results according to an embodiment of the present invention. As illustrated in FIG. 4A, twisting can be restrained compared to the results of the comparative example of FIG. 3A where the flow rate of each gas is controlled to be constant and the temperature of the loading table 20 is controlled to 100° C. Further, twisting can be prevented even when the aspect ratio is 25 as illustrated in FIG. 4.

As described above, the etching method of this embodiment is performed by controlling the temperature of the loading table 20 to a high temperature of 100° C. and changing the flow rate of etching gas in multiple etching steps (first to fourth steps). That is, of the gas supplied into the chamber 10, HBr gas is gradually reduced. Further, with this etching method, the flow rate of $O_2$ gas is controlled so that the flow rate ratio of $O_2$ gas to HBr gas increases as the etching process progresses. Further, the flow rate of $NF_3$ gas is controlled to be constant in all of the steps or controlled to increase as the flow rate of $O_2$ gas increases. Thereby, twisting and bowing can be prevented from occurring during the etching process (see FIG. 2C and FIG. 5A). Thus, the etching shape of the etched hole of the polysilicon film 12 can be formed in a substantially vertical shape as illustrated in FIG. 5B.

Next, the flow of the etching method according to an embodiment of the present invention is briefly described with reference to FIG. 6. In the beginning of the etching method, the control part 100 supplies $CF_4$ gas and $O_2$ gas into the chamber 10 and removes the natural oxide film of the mask 11 on a substrate by the plasma generated by the $CF_4$ gas and $O_2$ gas (Step S10).

Then, the control part 100 determines whether the etching of the first step is completed (Step S14). In a case where the etching of the first step is determined to be completed, the control part 100 gradually reduces the flow rate of the HBr gas from the second step to the fourth step (Step S16). Then, the control part 100 gradually increases the flow rate of $O_2$ gas relative to HBr gas from the second step to the fourth step (Step S18). Thereby, the etching method is finished. Accordingly, the etched hole formed in the polysilicon film 12 can have a satisfactory etching shape.

Modified Example

Next, an etching method according to a modified example of the above-described embodiment is described. The control range of the high-frequency electric power LF for biasing is optimized for improving the prevention of twisting.

Figure 7:
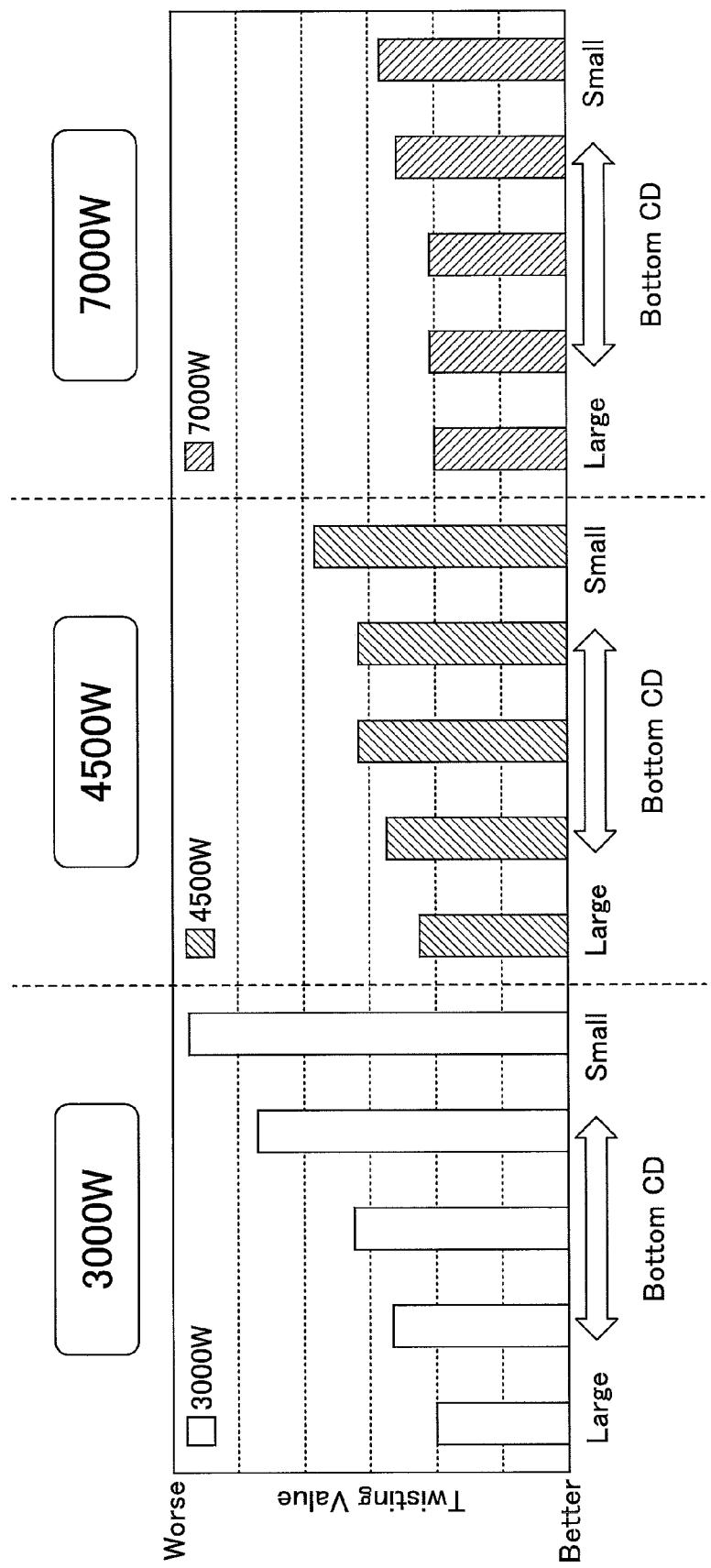
FIG. 7 is a diagram depicting a bottom critical dimension (CD) value and a twisting value in a high-frequency power LF according to a modified example of the present invention.

Conventionally, the upper limit of the control range of the high-frequency electric power LF for biasing is less than 1500 W. In contrast, the control part 100 controls the high-frequency electric power LF for biasing to a high range of 4000 W to 10000 W. For example, FIG. 7 depicts an example of the etching method of the modified example and its twisting status. The etching method of the modified example is performed under the following process conditions.

| | |
|---|---|
| Pressure | 30 mT (4.00 Pa) to 90 mT (12.0 Pa) |
| High-frequency electric power HF | 300 W to 700 W |
| High-frequency electric power LF | 3000 W, 4500 W, 7000 W (pulse wave (frequency 0.1 kHz, Duty ratio 20%) |
| Gas | $HBr/NF_3/O_2$ |
| Etching time | 90 seconds |
| Temperature of Loading table 20 | 65° C. to 100° C. |

Note that the frequency of the pulse wave of the high-frequency electric power LF may range from 0.1 kHz to 50 kHz). Further, the duty ratio may range from 5% to 30%.

Figure 8:
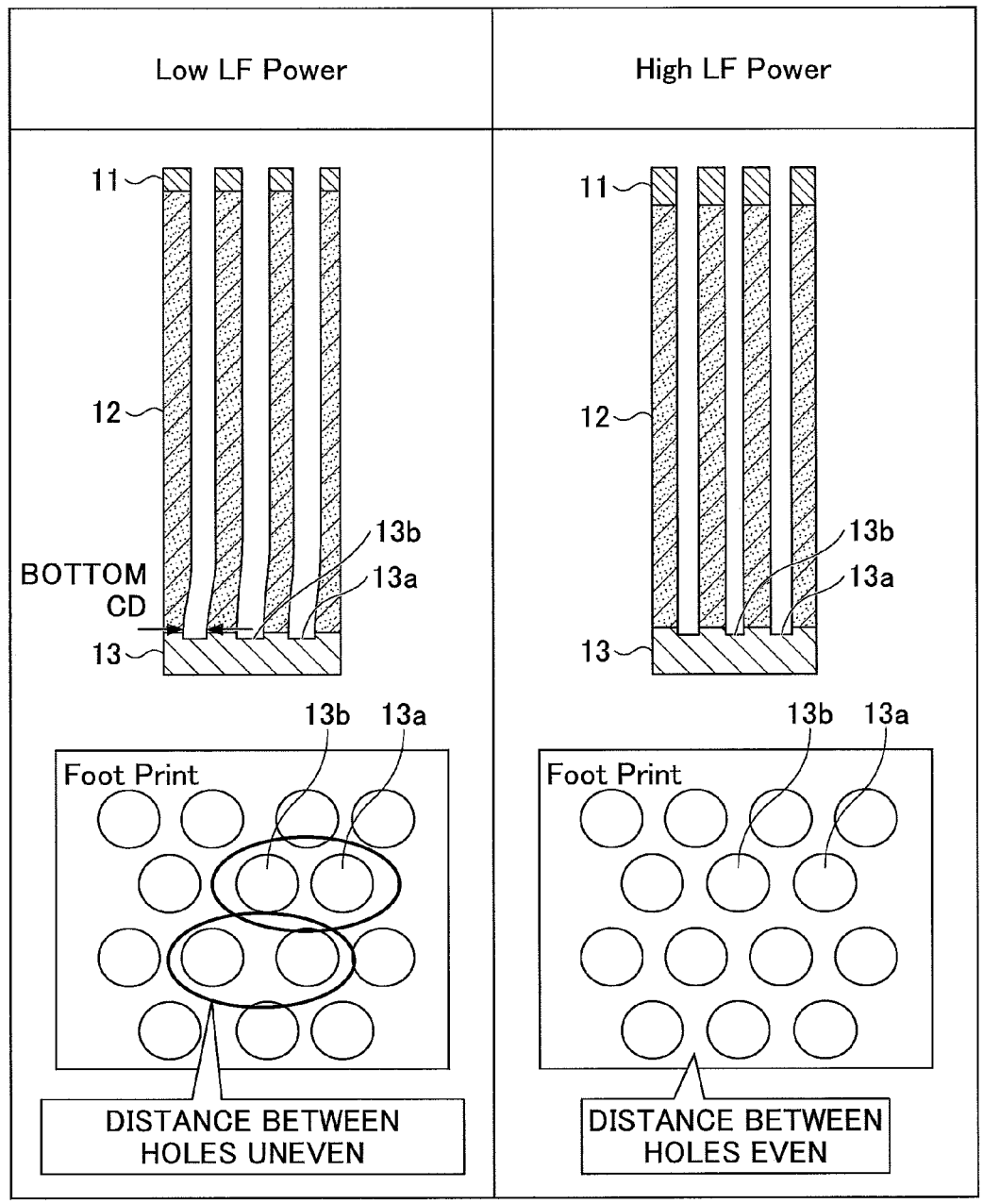
FIG. 8 is a diagram depicting twisting values according to a modified example of the present invention.

FIG. 7 depicts the results in the cases of applying power where the pulse wave of the high-frequency electric power for biasing are 3000 W, 4500, and 7000. The vertical axis in FIG. 7 indicates a bottom CD. As illustrated in FIG. 8, the bottom CD is the diameter of the bottom of an etched hole formed in the polysilicon film 12. In the horizontal axis of FIG. 7, "middle" indicates that the bottom CD is 12% relative to "large" and "small" indicates that the bottom CD is 25% relative to "large".

The vertical axis of FIG. 7 indicates a twisting value. The twisting value is based on the deviation (3σ) of the scattering of distances between etched holes according to the shapes of the bottoms of the etched holes (foot prints) depicted in FIG. 8. The example of FIG. 8 depicts that the twisting value is higher when the high-frequency electric power LF for biasing is low compared to when the high-frequency electric power LF for biasing is high.

According to the results of FIG. 7, the twisting value becomes worse as the bottom CD becomes closer to "small" when the applied pulse wave of high-frequency electric power LF for biasing is 3000 W. This is because it becomes more difficult for the ions in the plasma to travel in a narrow hole and reach the bottom of the etched hole as the bottom CD becomes smaller as illustrated in FIG. 9A. As a result, the ions bend and causes twisting before the ions reach the bottom of the etched hole.

In comparison with the case where the applied pulse wave of high-frequency electric power LF for biasing is 3000 W, the twisting value is prevented from becoming worse even if the bottom CD becomes closer to "small" when the applied pulse wave of high-frequency electric power LF for biasing is 4500 W and 7000 W. In other words, twisting that is caused by ions bending in the vicinity of the bottom of the etched hole can be improved. This is because ion energy increases to increase the straightness of the ions. As a result, the number of ions reaching the bottom of the etched hole increases.

Note that the high-frequency electric power LF for biasing is a pulse wave that repeatedly fluctuates during a period where the high-frequency electric power LF for biasing is applied (ON) and during a period where the high-frequency electric power LF for biasing is not applied (OFF). Accordingly, etching is accelerated during a period where the high-frequency electric power LF is on whereas gases inside an etched hole is exhausted outside of the etched hole during a period where the high-frequency electric power LF is off. Thereby, an opening of the mask film (see (2) of FIG. 9A can be prevented from being narrowed by reaction products during an etching process (i.e., prevention of mask clogging). Further, a portion of an etched hole can be prevented from being narrowed by reaction products adhered to a side surface of the etched hole (see (2) of FIG. 9A (i.e., prevention of necking). Thereby, ions can reach the bottom of the etched hole more easily.

With the above-described etching method of the modified example, the ion energy inside plasma can be increased when a pulse wave of a high-frequency electric power LF for biasing is applied with a power greater than or equal to 4000 W. Thereby, ions can easily reach the bottom of the etched hole. Accordingly, prevention of twisting can be improved, so that a satisfactory etching shape can be obtained and etching can be accelerated. As a result, a hole or a groove having an aspect ratio ranging from 20 to 25, and more preferably greater than or equal to 25 can be satisfactory formed by etching.

Note that the etching method of the modified example may be performed by controlling the high-frequency electric power LF for biasing while controlling the HBr gas, the $NF_3$ gas, and the $O_2$ gas as illustrated in FIG. 3B. Alternatively, the etching method of the modified example may be performed by controlling the high-frequency electric power LF for biasing while controlling the HBr gas, the $NF_3$ gas, and the $O_2$ gas at a constant as flow rate as illustrated in FIG. 3A.

Etching methods and etching apparatuses are described above based on the embodiments of the present invention. The present invention, however, is not limited to the specifically disclosed embodiments, and variations and modifications may be made without departing from the scope of the present invention. Configurations described in the embodiments may be combined to the extent that there is no inconsistency between the configurations.

For example, the temperature of the substrate is preferably higher than or equal to 100° C., and more preferably in a range from 100° C. to 200° C. The temperature of the substrate may be the temperature (surface temperature) of the loading table 20 or the temperature of the electrostatic chuck 10.

For example, an etching method according to an embodiment of the present invention may be applied to not only CCP processing apparatuses but also other etching apparatuses. Examples of other etching apparatuses include inductively coupled plasma (ICP) apparatuses, plasma processing apparatuses using a radial line slot antenna, helicon wave plasma (HWP) apparatuses, and electron cyclotron resonance (ECR) plasma apparatuses.

Furthermore, examples of substrates processed by an etching apparatus according to an aspect of the present invention include not only wafers but also large substrates for a flat panel display (FPD), electroluminescence (EL) elements, and substrates for a solar battery.

What is claimed is:

1. A method for etching a silicon film formed on a substrate, the method comprising:
   a first process of supplying HBr gas, $NF_3$ gas, and $O_2$ gas into a chamber and performing a first etching process on a silicon film with a plasma generated by the supplied HBr gas, $NF_3$ gas, and $O_2$ gas,
   a second process of continuously supplying the HBr gas, the $NF_3$ gas, and the $O_2$ gas into the chamber and performing a second etching process on a base film with the plasma generated by the supplied HBr gas, $NF_3$ gas, and $O_2$ gas,
   gradually reducing a flow rate of the HBr gas during the first and second etching processes, and
   adjusting a flow rate of the $O_2$ gas according to the reduction of the HBr gas so as to gradually increase a flow rate ratio of the $O_2$ gas relative to the HBr gas.

2. The method as claimed in claim 1, wherein the flow rate of the HBr is gradually reduced during the etching processes including the last etching process of the etching processes.

3. The method as claimed in claim 1, wherein the flow rate of the $O_2$ gas is gradually increased.

4. The method as claimed in claim 1, further comprising:
   controlling the $NF_3$ gas to a constant flow rate or increasing the flow rate of the $NF_3$ gas;
   wherein when the flow rate of the $NF_3$ gas is increased, the flow rate of the $O_2$ gas is increased according to the increase of the $NF_3$ gas.

5. The method as claimed in claim 1, wherein a temperature of the substrate is adjusted to range from 100° C. to 200° C.

6. The method as claimed in claim 1, wherein the plurality of etching processes includes applying a pulse wave of a high-frequency electric power LF for biasing, the pulse wave having a power greater than or equal to 4000 W.

7. The method as claimed in claim 6, wherein a frequency of the pulse wave of the high-frequency electric power LF for biasing ranges from 0.1 kHz to 50 kHz and has a duty ratio from 5% to 30%.

8. An etching apparatus for etching a silicon film formed on a substrate, the etching apparatus comprising:
    a control part configured to perform the steps of:
        a first process of supplying HBr gas, $NF_3$ gas, and $O_2$ gas into a chamber and performing a first etching process on a silicon film with a plasma generated by the supplied HBr gas, $NF_3$ gas, and $O_2$ gas,
        a second process of continuously supplying the HBr gas, the $NF_3$ gas, and the $O_2$ gas into the chamber and performing a second etching process on a base film with the plasma generated by the supplied HBr gas, $NF_3$ gas, and $O_2$ gas,
        gradually reducing a flow rate of the HBr gas during the first and second etching processes, and
        adjusting a flow rate of the $O_2$ gas according to the reduction of the HBr gas so as to gradually increase a flow rate ratio of the $O_2$ gas relative to the HBr gas.

9. The etching apparatus as claimed in claim 8, wherein the control part is further configured to apply a pulse wave of a high-frequency electric power LF for biasing, the pulse wave having a power greater than or equal to 4000 W.

10. The method as claimed in claim 1, wherein the adjusting the flow rate of the $O_2$ gas includes gradually increasing the flow rate of the $O_2$ gas when the flow rate of the HBr is gradually reduced.

11. The method as claimed in claim 1, wherein the base film includes at least one of a silicon oxide film and a silicon nitride film.

* * * * *